United States Patent
Ding et al.

(10) Patent No.: US 6,630,397 B1
(45) Date of Patent: Oct. 7, 2003

(54) METHOD TO IMPROVE SURFACE UNIFORMITY OF A LAYER OF ARC USED FOR THE CREATION OF CONTACT PLUGS

(75) Inventors: Jackie Ding, Yunlin (TW); Sheng-Fen Chiu, Taichung (TW); Chi-Long Chung, Shiang-Miao-li (TW)

(73) Assignee: ProMos Technologies, Hsin-Chu (TW)

( * ) Notice: Subject to any disclaimer, the term of this patent is extended or adjusted under 35 U.S.C. 154(b) by 0 days.

(21) Appl. No.: 10/315,532

(22) Filed: Dec. 10, 2002

(51) Int. Cl.$^7$ .......................................... H01L 21/4763
(52) U.S. Cl. ...................... 438/636; 438/210; 438/233; 438/736; 438/737; 438/738
(58) Field of Search .................... 438/636, 210, 438/233, 736, 737, 738

(56) References Cited

U.S. PATENT DOCUMENTS

| | | | | |
|---|---|---|---|---|
| 5,633,210 A | * | 5/1997 | Yang et al. | 438/636 |
| 5,883,006 A | * | 3/1999 | Iba | 438/738 |
| 6,001,541 A | * | 12/1999 | Iyer | 438/636 |
| 6,090,674 A | * | 7/2000 | Hsieh et al. | 438/636 |
| 6,225,234 B1 | * | 5/2001 | Miller et al. | 438/737 |
| 6,258,727 B1 | * | 7/2001 | Maccagnan | 438/636 |
| 2001/0029106 A1 | * | 10/2001 | Miller et al. | 438/737 |
| 2002/0039820 A1 | * | 4/2002 | Ireland et al. | 438/636 |

* cited by examiner

Primary Examiner—John F. Niebling
Assistant Examiner—Lynne A. Gurley
(74) Attorney, Agent, or Firm—George O. Saile; Stephen B. Ackerman

(57) ABSTRACT

In accordance with the objectives of the invention a new processing sequence is provided for the creation of a layer of ARC. A first layer of ARC is deposited over a supporting surface, a blanket etch is performed to the surface of the first layer of ARC, leaving any openings that have been created in the supporting surface essentially filled with ARC material. A second layer of ARC is next applied over the surface of the etched first layer of ARC, this second layer of ARC provides a layer of ARC that is of uniform thickness over the supporting surface. Steps of baking may be applied to each of the layers of ARC after these layers have been deposited or after the first layer of ARC has been etched.

26 Claims, 4 Drawing Sheets

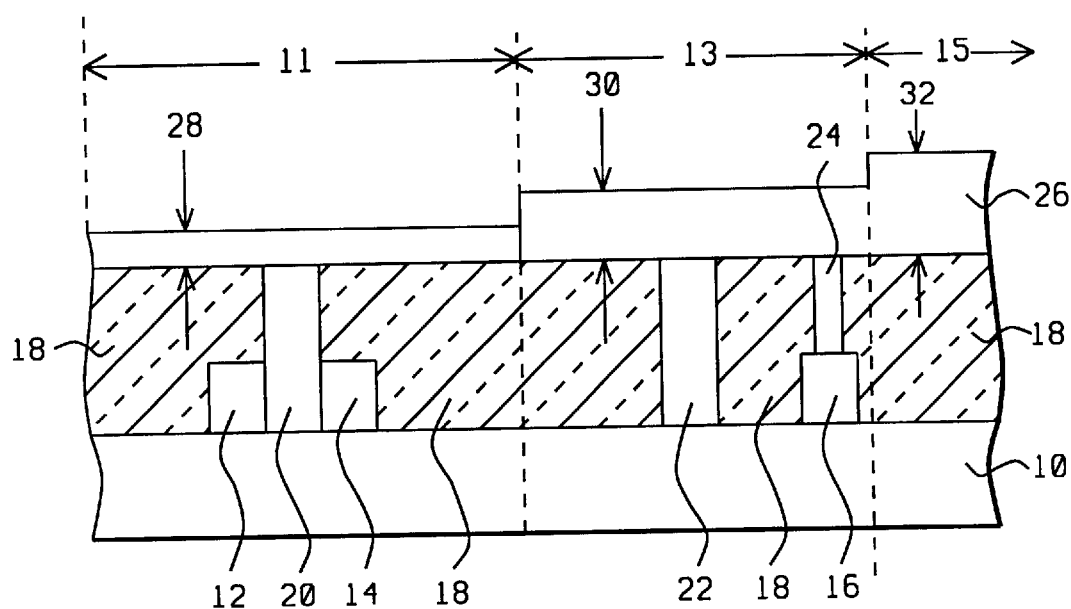
FIG. 1 — Prior Art
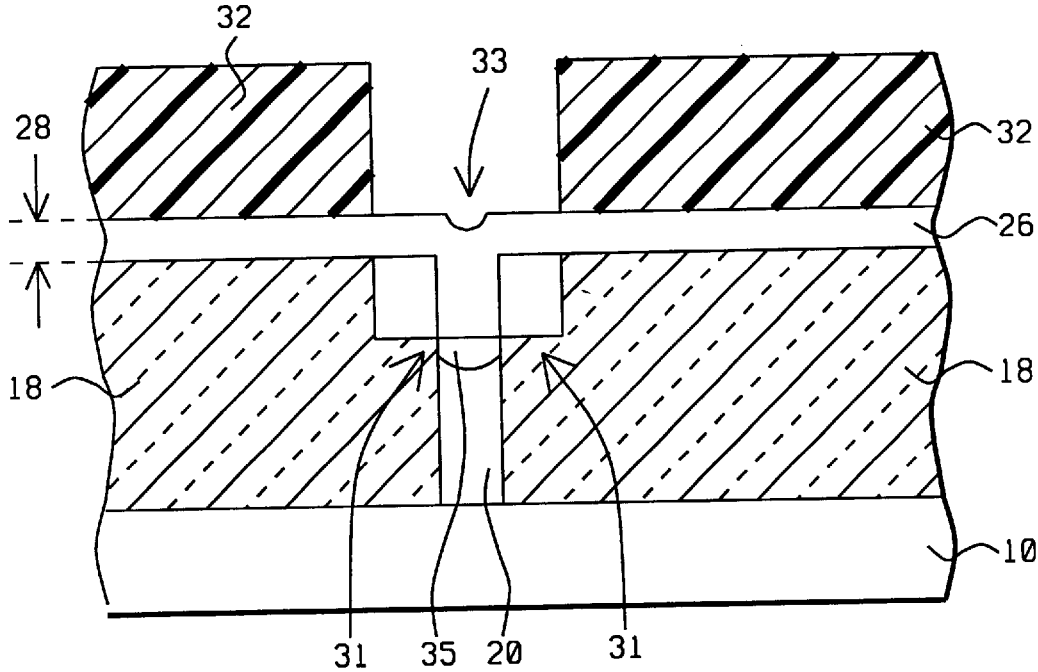
FIG. 2 — Prior Art

US 6,630,397 B1

METHOD TO IMPROVE SURFACE UNIFORMITY OF A LAYER OF ARC USED FOR THE CREATION OF CONTACT PLUGS

BACKGROUND OF THE INVENTION (1) Field of the Invention

The invention relates to the fabrication of integrated circuit devices, and more particularly, to a method of creating an improved layer of Anti Reflective Coating and therewith improved contact plugs for sub-micron devices.

(2) Description of the Prior Art

Continued decrease in the dimensions of semiconductor devices places more stringent requirements on the creation of sub-micron openings that are used to create contact plugs to the devices. Typically a layer of photoresist is used for the patterning and etching of layers of dielectric into which the contact plugs are created. Applying methods of photolithography involves reproducing an image, that is contained in an optical mask, in a layer of photoresist that is deposited over the surface of for instance a layer of dielectric. The optical mask is positioned between a radiation source of energy and the layer of photoresist. The image that is contained over the surface of the optical mask is transposed onto the underlying layer of photoresist by exposing the layer of photoresist through the optical mask. The pattern that is contained over the surface of the optical mask can be transparent to light with an opaque background or can inversely be an opaque pattern surrounded by a transparent background. By combining the light transmission characteristics of the optical mask with positive or negative reactive characteristics of the layer of photoresist, the layer of photoresist is converted by the photolithographic exposure to a readily removable substance resulting in reproducing the pattern that is contained over the surface of the optical mask in the layer of photoresist.

It is clear that the pattern of openings and trenches that is created in the layer of photoresist must meet very specific design requirements in order to create for instance satisfactorily performing interconnect lines or interconnect vias. This latter requirement results in the requirement that the exposure of the layer of photoresist must be uniform and must penetrate the layer of photoresist with equal energy throughout the height of the layer of photoresist. Uniformity of light penetration into and through the layer of photoresist does not allow for random reflection of light, since such a random reflection of light contributes to an arbitrary distribution of light energy throughout the region of exposure along the path of exposure. Light that penetrates a layer of photoresist will be reflected if this light penetrates through the layer of photoresist and encounters, after this penetration, a surface that reflects the light back in the approximate direction of the source of light energy. This approximate direction of light reflection is, among other factors, influenced by the planarity or topography of the reflecting surface and by the material that is contained in the reflecting surface. Further contributing to the negative impact that the reflected light has on the quality of the exposure is the fact that, in passing through a layer of photoresist, light energy will be absorbed, making the concentration or density of the reflected light dependent on the height of the layer of photoresist and having an effect throughout the height of the layer of photoresist that varies with the depth within the layer of photoresist. To avoid such complications, a conventional method is to assure that little or no light is reflected by an underlying surface, this is accomplished by using for the underlying surface a material that does not reflect light, commonly referred to as a layer of Anti Reflective Coating or ARC. Best results of suppression of reflection of photo-energy is obtained by using organic materials for the layer of ARC, examples of materials that can be used for anti reflective coatings include aluminum, silicon, titanium, zirconium, hafnium, chromium, and the like. The thickness of a layer of ARC is frequently not critical and can range between about 50 and 2,500 Angstrom. A layer of ARC can in addition be applied as an etch stop layer.

In a conventional processing flow, a layer of ARC is deposited over a supporting surface after which a pattern of trenches or openings is formed. Metal is deposited over the created openings and further processed for the creation of interconnect lines or contact plugs or contact vias. For many of the contact plugs that are created in order to interconnect devices, polysilicon is used as the preferred material for the contact plugs. For such applications, no problems are encountered in the deposition of a layer of ARC. The invention addresses concerns that are experienced for the creation of contact plugs of small critical dimensions where, using conventional processes, layers of ARC material will remain in place inside contact openings, resulting in imperfect contact openings.

U.S. Pat. No. 5,883,006 (Iba) reveals an opening process using BARL and Shipply resist.

U.S. Pat. No. 6,090,674 (Hsieh et al.) shows a method of forming a hole using an anti reflective coating.

U.S. Pat. No. 6,001,541 (Iyer) shows a method of forming a contact opening including an anti reflective coating.

SUMMARY OF THE INVENTION

A principle objective of the invention is to improve uniformity of the thickness of a layer of Anti Reflective Coating that is used for the creation of contact openings.

Another objective of the invention is to create a layer of Anti Reflective Coating that is uniform and that does not show irregular effects of cross section such as a hollow-shape or "ear-effects".

Yet another objective of the invention is to create a layer of Anti Reflective Coating of uniform thickness over a supporting surface.

A still further objective of the invention is to create a layer of Anti Reflective Coating of reduced thickness over a supporting surface.

In accordance with the objectives of the invention a new processing sequence is provided for the creation of a layer of ARC. A first layer of ARC is deposited over a supporting surface, a blanket etch is performed to the surface of the first layer of ARC, leaving any openings that have been created in the supporting surface essentially filled with ARC material. A second layer of ARC is next applied over the surface of the etched first layer of ARC, this second layer of ARC provides a layer of ARC that is of uniform thickness over the supporting surface. Steps of baking may be applied to each of the layers of ARC after these layers have been deposited or after the first layer of ARC has been etched.

BRIEF DESCRIPTION OF THE DRAWINGS

FIG. 1 shows a cross section in an X-direction of conventional contact plugs formed to a substrate and to the source and the surface of a gate electrode.

FIG. 2 shows a cross section in an Y-direction of a conventional contact plug formed to a substrate.

DESCRIPTION OF THE PREFERRED EMBODIMENTS

Figure 3:
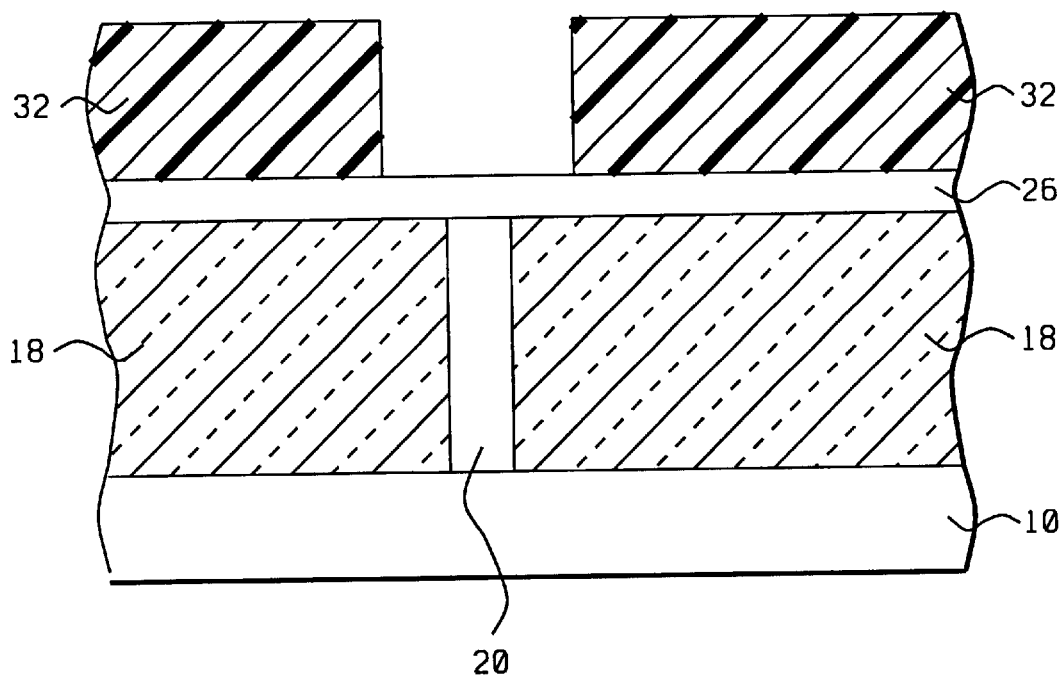
FIG. 3 shows a cross section in an Y-direction of a contact plug formed to a substrate using the method of the invention.

Requirements of device creation for the present era of devices having sub-micron device dimensions make it desirable to create plugs of materials other than polysilicon, this for reasons of device performance and device reliability. Device contact points can be differentiated between contact plugs that contact the surface of the gate electrode (CG plugs), contact plugs that contact the source of the gate electrode (CS plugs) and contact plugs that contact the surface of the substrate (CB plugs). Previous technology applies plugs of polysilicon for the CB plug and plugs of tungsten (W) for the CS and CG plugs. Since these plugs have been created prior to the coating of a layer of ARC, no ARC material can flow into the plug openings.

The CG, CS and CB contact plugs establish electrical contact with elements of conventional Dynamic Random Access Memory (DRAM) devices, such as bit and word lines that are part of a DRAM device. The operational and structural details of these DRAM devices are not of significance to the invention and will therefore not be further discussed at this time.

The invention addresses previously highlighted concerns of creating a uniform in thickness layer of ARC over a supporting surface such that this layer of ARC can be successfully applied for the creation of device features such as openings and trenches in a layer of photoresist that is deposited over the surface of the layer of ARC.

Of prime concern in creating a layer of ARC is that this layer must have a uniform thickness over the supporting surface, that is the thickness of the layer of ARC must not depend on the pattern and the topography that has been created in the supporting surface. The creation of a layer of ARC must therefore take into account hole density in the supporting surface. In surface areas of the supporting surface that have a high contact density and therefore a high density of openings in the surface, the deposited layer of ARC will penetrate this dense pattern of contact openings at a higher rate than a surface area where contact openings are less dense. This results in a final layer of ARC that is thinner over the surface area of the supporting surface that has a dense concentration of contact openings and relatively thicker over a surface area that has a less dense pattern of contact openings. In conventional technology this does not present a problem since all the contact openings (that is the CB, CS and CG plugs) are filled with polysilicon and therefore absorb the deposited layer of ARC at an equal rate across the surface of the wafer. It has been observed that using the current processing methods, the thickness of the layer of ARC is between about 75 and 85 nm in the surface area where the arrays are created (high density of contact openings) and between about 110 and 125 nm in the peripheral surface area where CS and CG contact plugs (low density of contact openings) are created. A flat surface area for these conditions has been measured as having a thickness of more than 125 nm. These numbers apply to the deposition of a layer of ARC of a target thickness of deposition of about 135 nm. From this it follows that the process of creating openings in an overlying layer of material, such as a layer of photoresist, has a relatively small processing window since this layer must now be developed successfully while the layer of ARC has a large variation in thickness. A small processing window is always a disadvantage in a semiconductor processing procedure since this imposes extreme measures of control for the processing step. This then makes the control of the Critical Dimension (CD) of the created openings dependent on the amount of control that is exercised over the etch process for the creation of the holes.

The invention addresses the creation of a layer of ARC that is used for the creation of a first layer of metal (M0) overlying the layer of ARC, more specifically the invention addresses concerns of:

changing the material that is used for the creation of a CB plug from polysilicon to tungsten (W)

concerns of poor uniformity of the thickness of a layer of created ARC that is required underlying a layer of photoresist that is used for the creation of a first layer of metal (M0)

poor uniformity of the thickness of the layer of ARC results in having to deposit a thicker layer of ARC, that is in extending the time that is required to deposit the layer of ARC; this to assure that an adequate thickness of a layer of ARC is created over the controlling flat surface of the wafer a thick layer of ARC over the flat surface of the wafer results in over-etching of the layer of ARC overlying an active surface region of the wafer, which in turn results in having a negative impact on the CD of the created openings created in the overlying layer of photoresist, and from the above it is clear that it is critical that the uniformity of the thickness of the created layer of ARC must be improved.

It will be appreciated that a layer of ARC that is deposited over a surface will accumulate over that surface to a thickness that is dependent on the density of the openings that have been created in the surface. Particularly, for a typography that comprises a dense pattern of openings, the accumulation of the layer of ARC over this topography should be expected to be less that the accumulation of the layer of ARC over a surface that comprises a less dense pattern of openings. With a dense pattern of openings, the combined volume of the openings that have been created over a certain surface area is obviously larger than the combined volume of the openings of lesser density that have been created over a surface area of equal size. This larger volume is filled up with ARC, requiring more ARC than is required by the smaller volume, allowing for less accumulation of ARC over the dense pattern of openings than is the case with the accumulation of the layer of ARC over the less dense pattern. Consequently: it should be expected that the layer of ARC deposited over a dense pattern of opening has a thickness that is less than the thickness of a layer of ARC that is deposited over a less dense pattern of openings. This therefore raises the issue of uniformity of deposition of a layer of ARC.

FIGS. 1 through 3 further highlight the above-indicated aspects of the invention.

Referring now specifically to FIG. 1, there is shown a cross section of a DRAM cell in which the following elements have been highlighted:

10, a semiconductor surface—typically the surface of a substrate over which an array of DRAM cells is being created

11, the array region of a DRAM cell

12, 14 and 16, three gate electrodes that form part of an array of DRAM cells

13, the periphery region of a DRAM cell 15, the flat surface region over the surface of a wafer where essentially no active components are being created and that therefore can serve as a control area of the thickness of the layer of ARC that is deposited over the surface of the wafer 18, a layer of dielectric overlying the gate electrodes of the DRAM cell, contact plugs are to be created through layer 18 of dielectric 20, a CB contact plug 22, a CS contact plug 24, a CG contact plug 26, a layer of ARC created over the surface of layer 18 of dielectric 28, the thickness of the layer of ARC overlying the CG contact plug 20

30, the thickness of the layer of ARC overlying the CS contact plug 22 and the CG contact plug 24

32, the thickness of the layer of ARC overlying the flat surface region of the wafer.

For a conventional and typical application of a layer 26 of ARC the following is valid: the value of 32 is larger than the value of 30, which is larger than the value of 28. This is the issue that is addressed by the invention.

FIG. 2 shows a cross section taken in a direction that is perpendicular to the direction that the cross section of FIG. 1 has been taken, the cross section of FIG. 1 can be considered to have been taken in an X-direction in which case the cross section of FIG. 2 is taken in an Y-direction. Shown in the cross section of FIG. 2 is the photoresist mask 32 that has been created over the surface of the layer 26 of ARC in preparation for the etching of the trench 31 into layer 18 of dielectric. The CB plug 20 is, using conventional processing methods for the creation of a CB plug, filled will polysilicon up to level 35, resulting a indentation 33 of the deposited layer 26 of ARC material. This non-linear surface profile of layer 26 is detrimental to the uniform penetration of the layer 32 of dielectric by the photo energy that is used to create the photoresist mask 32.

FIG. 3 shows a cross section of the desired topography of the surface of layer 26 of ARC material where the surface of layer 26 is essentially, flat resulting in the elimination of random reflection of light from the surface of layer 26.

The invention essentially follows the processing sequence of:

1. use a first layer of ARC material to fill CB and CS openings; it must be noted that these openings are openings that penetrate the layer of dielectric in which the openings are to be created (over the full height of the layer of dielectric) and are therefore the openings of highest concern.
2. perform an etch-back of the deposited first layer of ARC, using the flat surface of the wafer as the controlling surface in continuing the etch-back to the point where no more ARC material is present overlying the flat surface of the wafer.
3. deposit a second layer of ARC material over the surface of the etched-back first layer of ARC material.

Various embodiments of the above-indicated sequence can be applied by varying the etch-back conditions (time and pressure) of the first layer of ARC and by applying steps of baking to the deposited layers of ARC.

Figure 4:
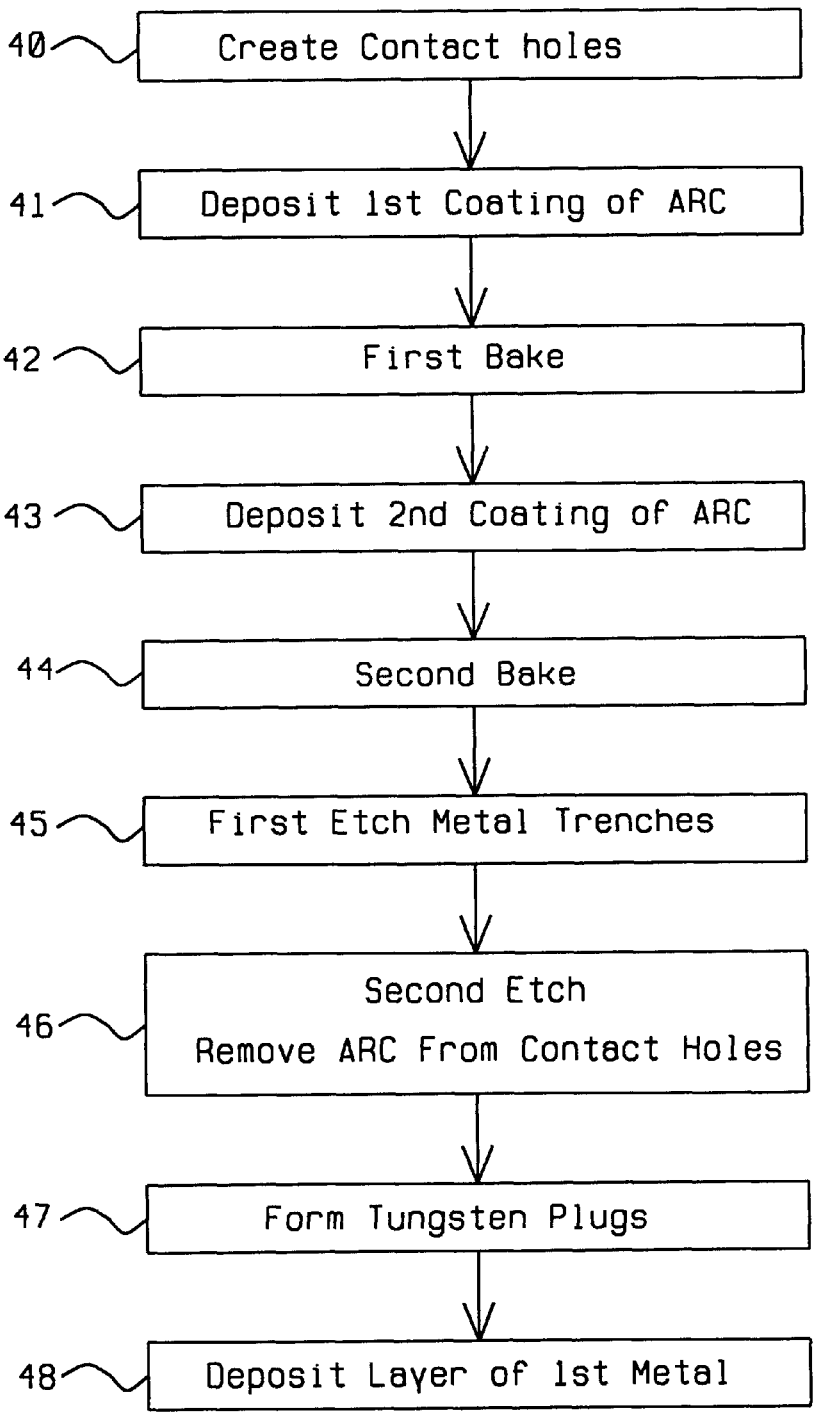
FIGS. 4 and 5 show processing flows of the invention.

Under the first embodiment of the invention, the invention provides the following processing steps, see the flow diagram of FIG. 4:

1. contact holes are created for CB, CS and CG plugs in a layer of dielectric, step 40, FIG. 4;
2. deposit a first layer of ARC, keeping the thickness of the deposited layer of ARC as a process control parameter; the preferred thickness of the first deposited layer of ARC is about 80 nm, step 41, FIG. 4;
3. baking the deposited first layer of ARC at a temperature between about 400 and 600 degrees C. for a time between about 30 and 90 seconds, step 42, FIG. 4;
4. deposit a second layer of ARC; the preferred thickness of the first deposited layer of ARC is about 80 nm, step 43, FIG. 4;
5. baking the deposited second layer of ARC at a temperature between about 400 and 600 degrees C. for a time between about 30 and 90 seconds, step 44, FIG. 4;
6. perform a first etch for the etching of trenches for the deposition of a first layer of metal, step 45, FIG. 4;
7. perform a second etch, essentially removing the ARC material from the CB, CS and CG plugs, step 46, FIG. 4;
8. deposit a layer of tungsten, forming tungsten plugs in the CB, CS and CG plug openings, step 47, FIG. 4, and
9. deposit the layer of first metal, step 48, FIG. 4.

Applying the above first embodiment of the invention has resulted in:

a thickness of the ARC layer overlying the CB plug of between about 120 and 128 nm a thickness of the ARC layer overlying the CS plug of between about 136 and 146 nm a thickness of the ARC layer overlying the flat surface of the wafer of between about 150 and 154 nm improving the ability to fill the opening that is created for the tungsten plug, however the difference in thickness between the ARC layer overlying the CB plug and the CS plug is unacceptably high at about 30 nm.

Figure 5:
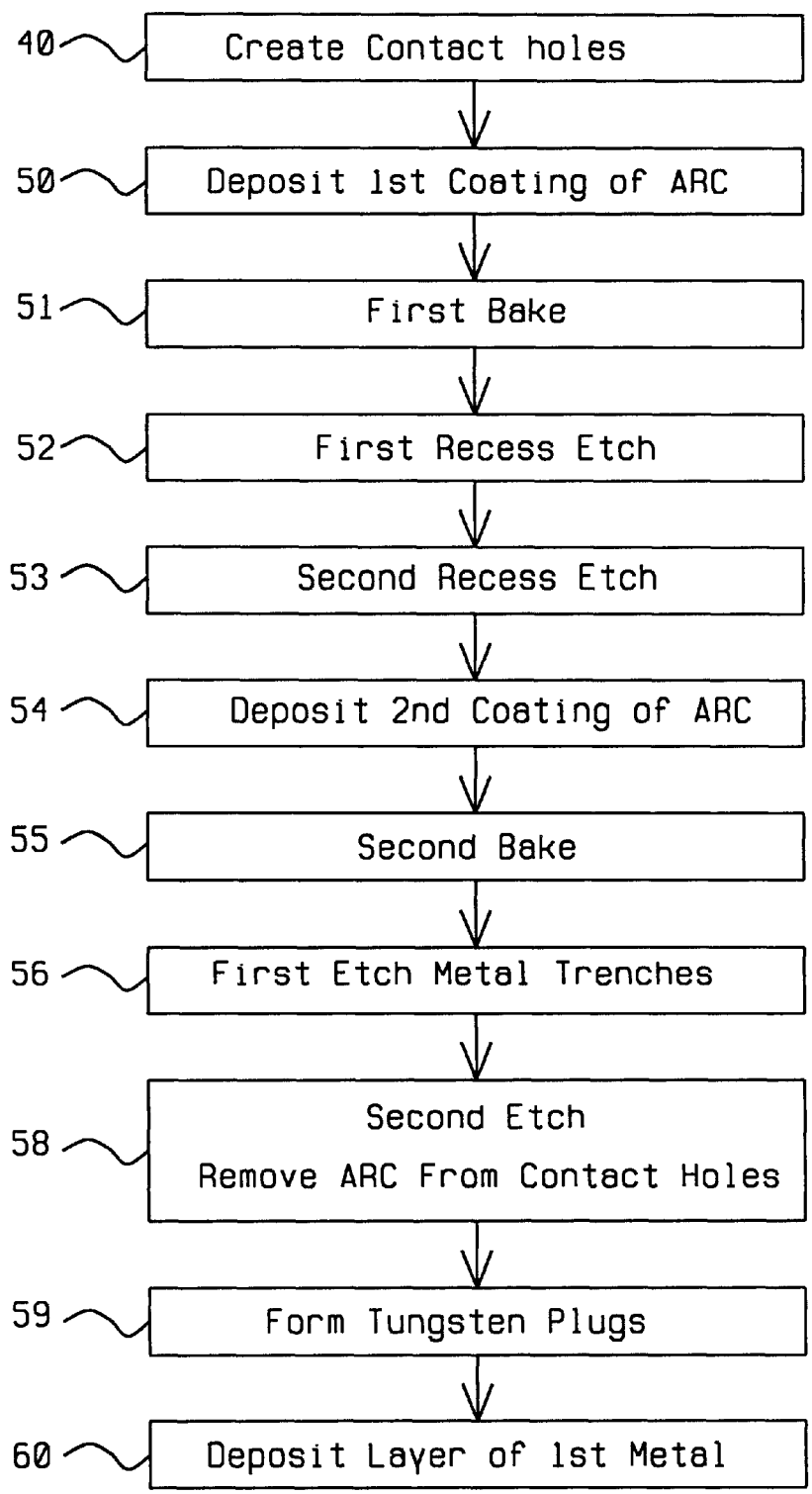

Under the second embodiment of the invention, the invention provides the following processing steps, see FIG. 5:

1. contact holes are created for CB, CS and CG plugs in a layer of dielectric, step 50, FIG. 5;
2. deposit a first layer of ARC, keeping the thickness of the deposited layer of ARC as a process control parameter; the preferred thickness of the first deposited layer of ARC is about 135 nm and can be within the range of between about 120 and 150 nm, step 51, FIG. 5;
3. baking the deposited first layer of ARC at a temperature between about 400 and 600 degrees C. for a time between about 30 and 90 seconds, step 52, FIG. 5;
4. perform a first recess etch of deposited first layer of ARC, applied for a time of about 90 seconds, step 53, FIG. 5;
5. perform a second recess etch of deposited second layer of ARC, applied for a time of about 10 seconds, step 54, FIG. 5;
6. deposit a second layer of ARC, keeping the thickness of the deposited layer of ARC as a process control parameter; the preferred thickness of the second deposited layer of ARC is about 80 nm and can be within the range of between about 70 and 90 nm, step 55, FIG. 5;
7. baking the deposited second layer of ARC at a temperature between about 400 and 600 degrees C. for a time between about 30 and 90 seconds, step 56, FIG. 5;
8. perform a first etch for the etching of trenches for the deposition of a first layer of metal, step 57, FIG. 5;
9. perform a second etch, essentially removing the ARC material from the CB, CS and CG plugs, step 59, FIG. 5;
10. deposit a layer of tungsten, forming tungsten plugs in the CB, CS and CG plug openings, step 59, FIG. 5;
11. deposit the layer of first metal, step 60, FIG. 5.

Applying the second embodiment of the invention has resulted in:

a thickness of the ARC layer overlying the CB plug of about 60 nm a thickness of the ARC layer overlying the CS plug of about 73 nm a thickness of the ARC layer overlying the flat surface of the wafer of about 74 nm improving the ability to create an opening having a desired profile for the tungsten plug, and the difference in thickness between the ARC layer overlying the CB plug and the CS plug is (a desirable low value of) about 14 nm.

Under the third embodiment of the invention, the invention provides processing steps that are identical to the processing steps as provided under the second embodiment of the invention but differ in the control parameter used during first recess etch of deposited first layer of ARC, which is now applied for a time of about 75 seconds.

Applying the above third embodiment of the invention has resulted in:

a thickness of the ARC layer overlying the CB plug of about 106 nm.

a thickness of the ARC layer overlying the CS plug of about 109 nm.

a thickness of the ARC layer overlying the flat surface of the wafer of about 132 nm improving the ability to create an opening having a desired profile for the tungsten plug, and the difference in thickness between the ARC layer overlying the CB plug and the CS plug is about 26 nm.

Under the fourth embodiment of the invention, the invention provides processing steps that are identical to the processing steps as provided under the second embodiment of the invention but differ in the control parameter used during first recess etch of deposited first layer of ARC, which is now applied for a time of about 70 seconds.

Applying the above fourth embodiment of the invention has resulted in:

a thickness of the ARC layer overlying the CB plug of about 117 nm.

a thickness of the ARC layer overlying the CS plug of about 119 nm.

a thickness of the ARC layer overlying the flat surface of the wafer of about 131 nm improving the ability to create an opening having a desired profile for the tungsten plug, and the difference in thickness between the ARC layer overlying the CB plug and the CS plug is about 14 nm.

The control parameters that are typically applied for the first and second recess etch of the deposited layer of ARC are as follows:

the first recess etch of the first layer of ARC: pressure about 130 mTorr, a power of about 300 Watts, a flow of $N_2$ at a flow rate of about 20 sccm, a flow of $H_2$ at a flow rate of about 20 sccm, applied for a time of about 75 seconds the second recess etch of the first layer of ARC: pressure about 25 mTorr, a power of about 300 Watts, a flow of $N_2$ at a flow rate of about 20 sccm, a flow of $H_2$ at a flow rate of about 20 sccm, applied for a time of about 10 seconds.

From the above detailed embodiments of the invention, the following conclusions can be drawn:

1. by improving the thickness of the layer of ARC, the time of deposition of a layer of ARC can be adjusted (fine-tuned).

2. the embodiments of the invention provide additional intervals of etch-back and surface coating, thus extending the control that is available for the creation of a layer of ARC, and 3. the openings that are created for the creation of tungsten contact plugs have the desirable profiles.

The processing sequence of the invention can be summarized as follows:

providing a substrate, the substrate having been provided with at least one semiconductor device over an active surface region of the substrate, the at least one semiconductor device comprising at least one Dynamic Random Access Device (DRAM), the surface of said substrate having been divided in an active surface region and a flat surface region in or over which no active devices are created;

depositing a layer of dielectric over the surface of the substrate, including the surface of the at least one DRAM cell provided over an active surface region of the substrate;

designating contact holes that need to be provided for the at least one DRAM cell, the contact holes comprising at least one first contact hole to the surface of the substrate in support of the at least one DRAM cell, the contact holes further comprising at least one second contact hole to a source region of the at least one DRAM cell, the contact holes further comprising at least one third contact hole to a gate electrode of the at least one DRAM cell;

patterning and first etching the layer of dielectric, creating openings through the layer of dielectric that align with the at least one first, with the at least one second and the at least one third contact hole that need to be provided for the at least one DRAM cell;

depositing a first coating of Anti Reflective Coating material over the surface of the layer of dielectric, at least filling the at least one first, the at least one second and the at least one third contact hole that need to be provided for the at least one DRAM cell with ARC material;

applying a first bake to the first coating of ARC;

etching the first coating of ARC, thereby reducing a thickness of the first coating of ARC, the etch continuing to a point where all ARC material is essentially removed from the flat surface region of the substrate;

depositing a second coating of Anti Reflective Coating material over the surface of the layer of dielectric;

applying a second bake to the second coating of ARC;

performing a second etch of the layer of dielectric, the second etch creating trenches for a first layer of metal in the surface of the layer of dielectric;

performing a third etch of the layer of dielectric, the third etch removing the ARC material from the at least one first and the at least one second and the at least one third contact hole that need to be provided for the at least one DRAM cell with ARC material;

filling the at least one first and the at least one second and the at least one third contact hole with tungsten, creating tungsten plugs through the at least one first and the at least one second and the at least one third contact hole, and depositing a layer of first metal over the surface of the layer of dielectric.

In addition, the first coating of ARC material can have a thickness of between about 120 and 150 nm. The second coating of ARC material can have a thickness of between about 120 and 150 nm. Also, the first coating of ARC material can have a thickness of between about 70 and 90 nm. Etching the first coating of ARC comprising a first and a second etch.

The above summary can further be expanded to use the invention for the purpose of addressing issues that are raised by the deposition of a layer of ARC over a surface that contains patterns of openings of various densities, from densely packed openings to less densely packed openings. For such an application, the following can be applied:

providing a substrate, the substrate having been provided with at least one semiconductor device over an active surface region of the substrate, the least one semiconductor device comprising at least one Dynamic Random Access Device (DRAM), the surface of the substrate having been divided in at least one surface area comprising a first pattern of densely packed contact holes and at least one second pattern of less densely packed contact holes to the surface of the substrate in support of the at least one DRAM cell;

depositing a layer of dielectric over the surface of the substrate, including the surface of the at least one DRAM cell provided over an active surface region of the substrate;

designating contact holes that need to be provided for the at least one DRAM cell, the contact holes comprising the at least one first pattern of densely packed contact holes to the surface of the substrate in support of the at least one DRAM cell, the contact holes further comprising the at least one second pattern of less densely packed contact holes to the surface of the substrate in support of the at least one DRAM cell;

patterning and first etching the layer of dielectric, creating openings through the layer of dielectric that align with the at least one first and at least one second pattern of contact holes that need to be provided for the at least one DRAM cell;

depositing a first coating of Anti Reflective Coating material over the surface of the layer of dielectric, at least filling the at least one first and at least one second pattern of contact holes that need to be provided for the at least one DRAM cell with ARC material;

applying a first bake to the first coating of ARC;

etching the first coating of ARC, thereby reducing a thickness of the first coating of ARC, the etch continuing to a point where all ARC material is essentially deposited to an equal thickness over the at least one first and at least one second pattern of contact holes;

depositing a second coating of Anti Reflective Coating material over the surface of the layer of dielectric;

applying a second bake to the second coating of ARC;

performing a second etch of the layer of dielectric, the second etch creating trenches for a first layer of metal in the surface of the layer of dielectric;

performing a third etch of the layer of dielectric, the third etch removing the ARC material from the at least one first and at least one second pattern of contact holes that need to be provided for the at least one DRAM cell with ARC material;

filling the at least one first and at least one second pattern of contact holes with tungsten, creating tungsten plugs through the first and second pattern of contact holes, and depositing a layer of first metal over the surface of the layer of dielectric.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to improve uniformity of a layer of Anti Reflective Coating (ARC) and to create a first level of metal, comprising the steps of:

providing a substrate, a layer of dielectric having been provided over the surface of said substrate, openings having been created through said layer of dielectric exposing points of electrical contact over the surface of said substrate;

depositing a first layer of ARC over the surface of said layer of dielectric;

baking said first layer of ARC;

reducing a thickness of said first layer of ARC;

depositing a second layer of ARC over the surface of said layer of dielectric; and baking said second layer of ARC.

2. The method of claim 1, said substrate having been provided with at least one semiconductor device over an active surface region of said substrate, said least one semiconductor device comprising at least one Dynamic Random Access Device (DRAM), the surface of said substrate having been divided in an active surface region and a flat surface region in or over which no active devices are created, a layer of dielectric having been deposited over the surface of said substrate, including the surface of said at least one DRAM cell provided over an active surface region of said substrate, contact holes having been provided for said at least one DRAM cell, said contact holes comprising at least one first contact hole to the surface of said substrate in support of said at least one DRAM cell, said contact holes further comprising at least one second contact hole to a source region of said at least one DRAM cell, said contact holes further comprising at least one third contact hole to a gate electrode of said at least one DRAM cell.

3. The method of claim 2, with additional processing steps of:

performing a first etch of said layer of dielectric, said first etch creating trenches for a first layer of metal in the surface of said layer of dielectric;

performing a second etch of said layer of dielectric, said second etch removing said ARC material from said at least one first and said at least one second and said at least one third contact hole that need to be provided for said at least one DRAM cell with ARC material;

filling said at least one first and said at least one second and said at least one third contact hole with tungsten, creating tungsten plugs through said at least one first and said at least one second and said at least one third contact hole; and depositing a layer of first metal over the surface of said layer of dielectric.

4. The method of claim 1, said first coating of ARC material having a thickness of between about 120 and 150 nm, said second coating of ARC material having a thickness of between about 120 and 150 nm.

5. The method of claim 1, said first coating of ARC material having a thickness of between about 70 and 90 nm.

6. The method of claim 1, said applying a first bake to said first coating of ARC comprises exposing said substrate to a temperature between about 400 and 600 degrees C. for a time between about 30 and 90 seconds, said applying a second bake to said first coating of ARC comprises exposing said substrate to a temperature between about 400 and 600 degrees C. for a time between about 30 and 90 seconds.

7. The method of claim 1, reducing a thickness of said first layer of ARC comprising a first and a second etch.

8. The method of claim 7, said first etch comprising applying a pressure of about 130 mTorr, a power of about 300 Watts, a flow of $N_2$ at a flow rate of about 20 sccm, a flow of $H_2$ at a flow rate of about 20 sccm, applied for a time of about 75 seconds.

9. The method of claim 7, said first etch comprising applying a pressure about 25 mTorr, a power of about 300 Watts, a flow of $N_2$ at a flow rate of about 20 sccm, a flow of $H_2$ at a flow rate of about 20 sccm, applied for a time of about 10 seconds.

10. A method to improve uniformity of a layer of Anti Reflective Coating (ARC) and to create a first level of metal, comprising the steps of:

providing a substrate, said substrate having been provided with at least one semiconductor device over an active surface region of said substrate, said least one semiconductor device comprising at least one Dynamic Random Access Device (DRAM), the surface of said substrate having been divided in an active surface region and a flat surface region in or over which no active devices are created; a layer of dielectric having been deposited over the surface of said substrate, including the surface of said at least one DRAM cell provided over an active surface region of said substrate, contact holes having been provided through said layer of dielectric, said contact holes comprising at least one first contact hole to the surface of said substrate in support of said at least one DRAM cell, said contact holes further comprising at least one second contact hole to a source region of said at least one DRAM cell, said contact holes further comprising at least one third contact hole to a gate electrode of said at least one DRAM cell;

depositing a first coating of Anti Reflective Coating material over the surface of said layer of dielectric;

applying a first bake to said first coating of ARC;

etching said first coating of ARC, thereby reducing a thickness of said first coating of ARC, said etch continuing to a point where all ARC material is essentially removed from said flat surface region of said substrate;

depositing a second coating of Anti Reflective Coating material over the surface of said layer of dielectric; and applying a second bake to said second coating of ARC.

11. The method of claim 10, with additional processing steps of:

performing a second etch of said layer of dielectric, said second etch creating trenches for a first layer of metal in the surface of said layer of dielectric;

performing a third etch of said layer of dielectric, said third etch removing said ARC material from said at least one first and said at least one second and said at least one third contact hole that need to be provided for said at least one DRAM cell with ARC material;

filling said at least one first and said at least one second and said at least one third contact hole with tungsten, creating tungsten plugs through said at least one first and said at least one second and said at least one third contact hole; and depositing a layer of first metal over the surface of said layer of dielectric.

12. The method of claim 10, said first coating of Anti Reflective Coating material deposited over the surface of said layer of dielectric at least entering with ARC material said at least one first, said at least one second and said at least one third contact hole that need to be provided for said at least one DRAM cell.

13. The method of claim 10, said first coating of ARC material having a thickness of between about 120 and 150 nm, said second coating of ARC material having a thickness of between about 120 and 150 nm.

14. The method of claim 10, said first coating of ARC material having a thickness of between about 70 and 90 nm.

15. The method of claim 10, said applying a first bake to said first coating of ARC comprises exposing said substrate to a temperature between about 400 and 600 degrees C. for a time between about 30 and 90 seconds, said applying a second bake to said first coating of ARC comprises exposing said substrate to a temperature between about 400 and 600 degrees C. for a time between about 30 and 90 seconds.

16. The method of claim 10, etching said first coating of ARC comprising a first and a second etch.

17. The method of claim 16, said first etch comprising applying a pressure of about 130 mTorr, a power of about 300 Watts, a flow of $N_2$ at a flow rate of about 20 sccm, a flow of $H_2$ at a flow rate of about 20 sccm, applied for a time of about 75 seconds.

18. The method of claim 16, said first etch comprising applying a pressure about 25 mTorr, a power of about 300 Watts, a flow of $N_2$ at a flow rate of about 20 sccm, a flow of $H_2$ at a flow rate of about 20 sccm, applied for a time of about 10 seconds.

19. A method to improve uniformity of a layer of Anti Reflective Coating (ARC) and to create a first level of metal, comprising the steps of:

providing a substrate, said substrate having been provided with at least one semiconductor device over an active surface region of said substrate, the surface of said substrate having been divided in at least one surface area comprising a first pattern of densely packed contact holes and at least one second pattern of less densely packed contact holes to the surface of said substrate in support of said at least one DRAM cell;

depositing a layer of dielectric over the surface of said substrate, including the surface of said at least one DRAM cell provided over an active surface region of said substrate;

designating contact holes that need to be provided for said at least one DRAM cell, said contact holes comprising said at least one first pattern of densely packed contact holes to the surface of said substrate in support of said at least one DRAM cell, said contact holes further comprising said at least one second pattern of less densely packed contact holes to the surface of said substrate in support of said at least one DRAM cell;

patterning and first etching said layer of dielectric, creating openings through said layer of dielectric that align with said at least one first and at least one second pattern of contact holes that need to be provided for said at least one DRAM cell;

depositing a first coating of Anti Reflective Coating material over the surface of said layer of dielectric, at least filling said at least one first and at least one second pattern of contact holes that need to be provided for said at least one DRAM cell with ARC material;

applying a first bake to said first coating of ARC;

etching said first coating of ARC, thereby reducing a thickness of said first coating of ARC, said etch continuing to a point where all ARC material is essentially deposited to an equal thickness over said at least one first and at least one second pattern of contact holes;

depositing a second coating of Anti Reflective Coating material over the surface of said layer of dielectric;

applying a second bake to said second coating of ARC;

performing a second etch of said layer of dielectric, said second etch creating trenches for a first layer of metal in the surface of said layer of dielectric;

performing a third etch of said layer of dielectric, said third etch removing said ARC material from said at least one first and at least one second pattern of contact holes that need to be provided for said at least one DRAM cell with ARC material;

filling said at least one first and at least one second pattern of contact holes with tungsten, creating tungsten plugs through said first and second pattern of contact holes; and depositing a layer of first metal over the surface of said layer of dielectric.

20. The method of claim 19, said first coating of ARC material having a thickness of between about 120 and 150 nm, said second coating of ARC material having a thickness of between about 120 and 150 nm.

21. The method of claim 19, said first coating of ARC material having a thickness of between about 70 and 90 nm.

22. The method of claim 19, said applying a first bake to said first coating of ARC comprises exposing said substrate to a temperature between about 400 and 600 degrees C. for a time between about 30 and 90 seconds, said applying a second bake to said first coating of ARC comprises exposing said substrate to a temperature between about 400 and 600 degrees C. for a time between about 30 and 90 seconds.

23. The method of claim 19, etching said first coating of ARC comprising a first and a second etch.

24. The method of claim 19, said first etch comprising applying a pressure of about 130 mTorr, a power of about 300 Watts, a flow of $N_2$ at a flow rate of about 20 sccm, a flow of $H_2$ at a flow rate of about 20 sccm, applied for a time of about 75 seconds.

25. The method of claim 19, said first etch comprising applying a pressure about 25 mTorr, a power of about 300 Watts, a flow of $N_2$ at a flow rate of about 20 sccm, a flow of $H_2$ at a flow rate of about 20 sccm, applied for a time of about 10 seconds.

26. The method of claim 19, said least one semiconductor device comprising at least one Dynamic Random Access Device (DRAM).

\* \* \* \* \*